(12) United States Patent
Lester

(10) Patent No.: US 8,552,465 B2
(45) Date of Patent: Oct. 8, 2013

(54) METHOD FOR REDUCING STRESS IN EPITAXIAL GROWTH

(75) Inventor: Steven D. Lester, Livermore, CA (US)

(73) Assignee: Toshiba Techno Center Inc., Tokyo (JP)

( * ) Notice: Subject to any disclaimer, the term of this patent is extended or adjusted under 35 U.S.C. 154(b) by 0 days.

(21) Appl. No.: 13/293,031

(22) Filed: Nov. 9, 2011

(65) Prior Publication Data

US 2012/0319160 A1  Dec. 20, 2012

(51) Int. Cl.
*H01L 33/12* (2010.01)

(52) U.S. Cl.
USPC .................. 257/103; 257/E33.023; 438/46

(58) Field of Classification Search
USPC .......................................................... 257/190
See application file for complete search history.

(56) References Cited

U.S. PATENT DOCUMENTS

| | | | |
|---|---|---|---|
| 5,306,662 A | 4/1994 | Nakamura et al. |
| 5,408,120 A | 4/1995 | Manabe et al. |
| 5,468,678 A | 11/1995 | Nakamura et al. |
| 5,563,422 A | 10/1996 | Nakamura et al. |
| 5,578,839 A | 11/1996 | Nakamura et al. |
| 5,734,182 A | 3/1998 | Nakamura et al. |
| 5,747,832 A | 5/1998 | Nakamura et al. |
| 5,753,939 A | 5/1998 | Sassa et al. |
| 5,777,350 A | 7/1998 | Nakamura et al. |
| 5,959,307 A | 9/1999 | Nakamura et al. |
| 5,959,401 A | 9/1999 | Asami et al. |
| 6,005,258 A | 12/1999 | Manabe et al. |
| 6,040,588 A | 3/2000 | Koide et al. |
| RE36,747 E | 6/2000 | Manabe et al. |
| 6,215,133 B1 | 4/2001 | Nakamura et al. |
| 6,265,726 B1 | 7/2001 | Manabe et al. |
| 6,326,236 B1 | 12/2001 | Koide et al. |
| 6,420,733 B2 | 7/2002 | Koide et al. |
| 6,541,293 B2 | 4/2003 | Koide et al. |
| 6,610,995 B2 | 8/2003 | Nakamura et al. |
| 6,657,236 B1 | 12/2003 | Thibeault et al. |
| 6,800,500 B2 | 10/2004 | Coman et al. |
| 6,838,693 B2 | 1/2005 | Kozaki |
| 6,849,881 B1 | 2/2005 | Harle et al. |
| 6,891,197 B2 | 5/2005 | Bhat et al. |
| 6,906,352 B2 | 6/2005 | Edmond et al. |

(Continued)

FOREIGN PATENT DOCUMENTS

| JP | 2626431 | 5/1994 |
|---|---|---|
| JP | 2681733 | 5/1994 |

(Continued)

*Primary Examiner* — Zandra Smith
*Assistant Examiner* — Paul Patton
(74) *Attorney, Agent, or Firm* — Hogan Lovells US LLP

(57) ABSTRACT

A device and method for making the same are disclosed. The device includes a substrate having a first TEC, a stress relief layer overlying the substrate, and crystalline cap layer. The crystalline cap layer overlies the stress relief layer. The cap layer has a second TEC different from the first TEC. The stress relief layer includes an amorphous material that relieves stress between the crystalline substrate and the cap layer arising from differences in the first and second TECs at a growth temperature at which layers are grown epitaxially on the cap layer. The device can be used to construct various semiconductor devices including GaN LEDs that are fabricated on silicon or SiC wafers. The stress relief layer is generated by converting a layer of precursor material on the substrate after the cap layer has been grown to a stress-relief layer.

15 Claims, 5 Drawing Sheets

(56) References Cited

U.S. PATENT DOCUMENTS

| | | |
|---|---|---|
| 6,916,676 B2 | 7/2005 | Sano et al. |
| 6,951,695 B2 | 10/2005 | Xu et al. |
| 6,977,395 B2 | 12/2005 | Yamada et al. |
| 7,026,653 B2 | 4/2006 | Sun |
| 7,106,090 B2 | 9/2006 | Harle et al. |
| 7,115,908 B2 | 10/2006 | Watanabe et al. |
| 7,138,286 B2 | 11/2006 | Manabe et al. |
| 7,193,246 B1 | 3/2007 | Tanizawa et al. |
| 7,262,436 B2 | 8/2007 | Kondoh et al. |
| 7,312,474 B2 | 12/2007 | Emerson et al. |
| 7,335,920 B2 | 2/2008 | Denbaars et al. |
| 7,345,297 B2 | 3/2008 | Yamazoe et al. |
| 7,348,602 B2 | 3/2008 | Tanizawa |
| 7,365,374 B2 * | 4/2008 | Piner et al. .................. 257/189 |
| 7,402,838 B2 | 7/2008 | Tanizawa et al. |
| 7,442,966 B2 | 10/2008 | Bader et al. |
| 7,446,345 B2 | 11/2008 | Emerson et al. |
| 7,491,565 B2 | 2/2009 | Coman et al. |
| 7,547,908 B2 | 6/2009 | Grillot et al. |
| 7,611,917 B2 | 11/2009 | Emerson et al. |
| 7,709,851 B2 | 5/2010 | Bader et al. |
| 7,737,459 B2 | 6/2010 | Edmond et al. |
| 7,754,514 B2 | 7/2010 | Yajima et al. |
| 7,791,061 B2 | 9/2010 | Edmond et al. |
| 7,791,101 B2 | 9/2010 | Bergmann et al. |
| 7,795,623 B2 | 9/2010 | Emerson et al. |
| 7,910,945 B2 | 3/2011 | Donofrio et al. |
| 7,939,844 B2 | 5/2011 | Hahn et al. |
| 7,947,994 B2 | 5/2011 | Tanizawa et al. |
| 8,021,904 B2 | 9/2011 | Chitnis |
| 8,030,665 B2 | 10/2011 | Nagahama et al. |

FOREIGN PATENT DOCUMENTS

| | | |
|---|---|---|
| JP | 2917742 | 6/1994 |
| JP | 2827794 | 8/1994 |
| JP | 2778405 | 9/1994 |
| JP | 2803741 | 9/1994 |
| JP | 2785254 | 1/1995 |
| JP | 2735057 | 3/1996 |
| JP | 2956489 | 3/1996 |
| JP | 2666237 | 12/1996 |
| JP | 2890396 | 12/1996 |
| JP | 3250438 | 12/1996 |
| JP | 3135041 | 6/1997 |
| JP | 3209096 | 12/1997 |
| JP | 3506874 | 1/1998 |
| JP | 3654738 | 2/1998 |
| JP | 3795624 | 2/1998 |
| JP | 3304787 | 5/1998 |
| JP | 3344257 | 8/1998 |
| JP | 3223832 | 9/1998 |
| JP | 3374737 | 12/1998 |
| JP | 3314666 | 3/1999 |
| JP | 4118370 | 7/1999 |
| JP | 4118371 | 7/1999 |
| JP | 3548442 | 8/1999 |
| JP | 3622562 | 11/1999 |
| JP | 3424629 | 8/2000 |
| JP | 4860024 | 8/2000 |
| JP | 3063756 | 9/2000 |
| JP | 4629178 | 9/2000 |
| JP | 3063757 | 10/2000 |
| JP | 3511970 | 10/2000 |
| JP | 3551101 | 5/2001 |
| JP | 3427265 | 6/2001 |
| JP | 3646649 | 10/2001 |
| JP | 3780887 | 5/2002 |
| JP | 3890930 | 5/2002 |
| JP | 3786114 | 4/2004 |
| JP | 4904261 | 6/2004 |

* cited by examiner

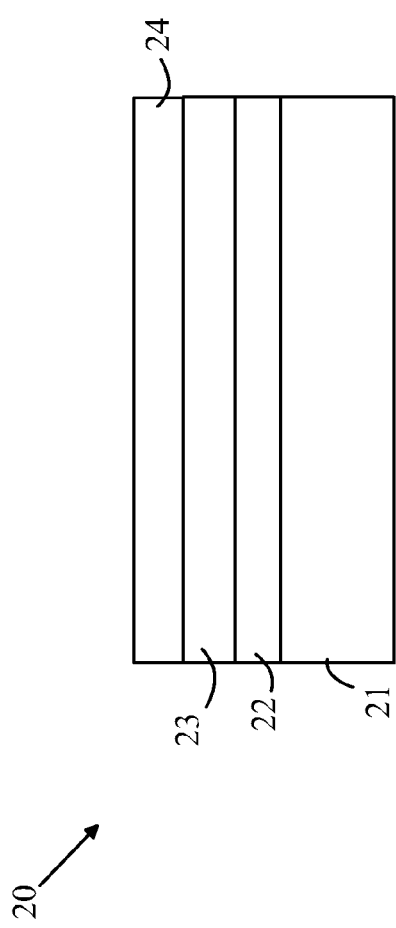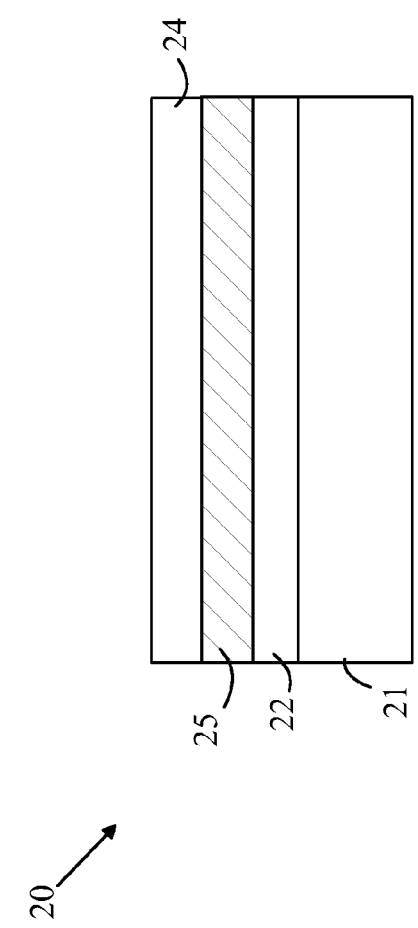

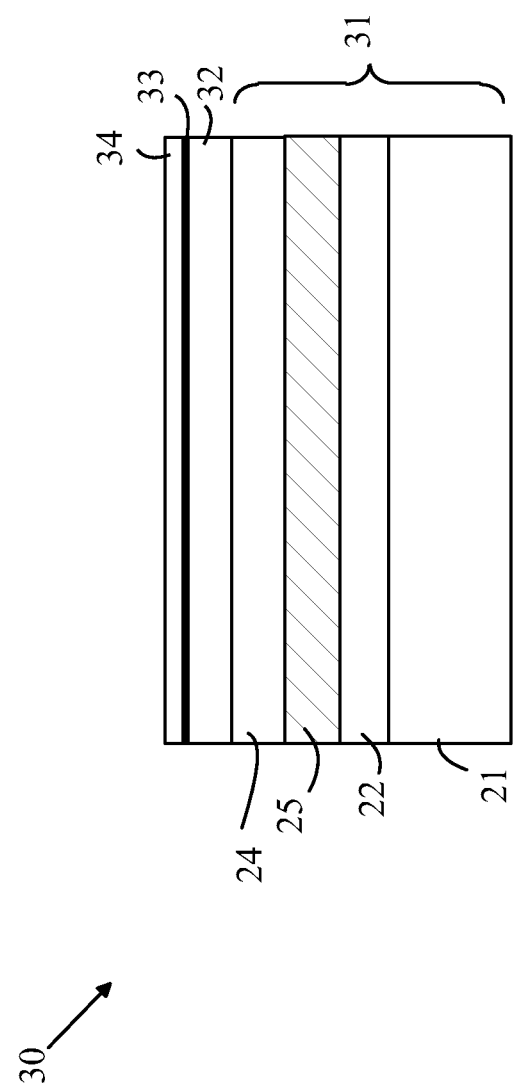

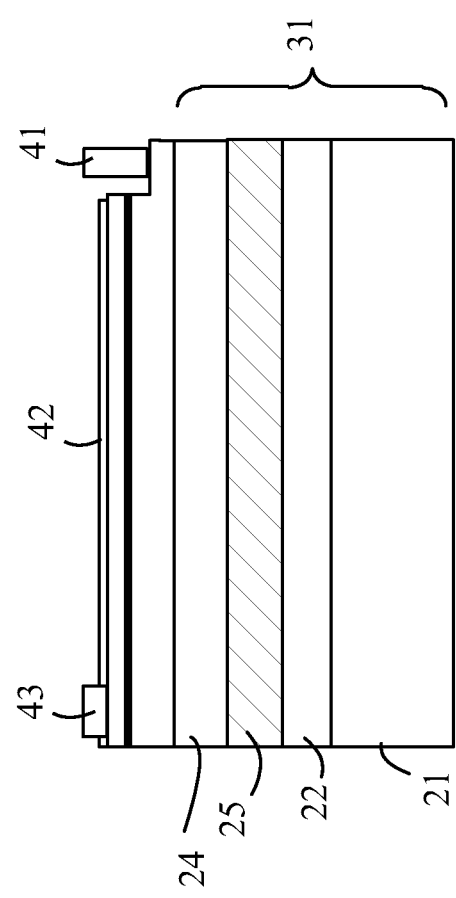

US 8,552,465 B2

METHOD FOR REDUCING STRESS IN EPITAXIAL GROWTH

BACKGROUND OF THE INVENTION

A number of semiconductor devices are fabricated by epitaxially growing a number of semiconductor layers on a substrate. For example, one class of light emitting diodes (LEDs) is constructed by growing a number of epitaxially grown layers of GaN semiconductors on a substrate. The yield of devices from the fabrication process is reduced by defects in the epitaxially grown layers. One source of defects is the mismatch in the thermal expansion coefficients (TECs) between the epitaxially grown layers and the substrate. In the case of GaN semiconductors grown on sapphire, significant mismatches between both the thermal expansion coefficients and the lattice constants exist.

The mismatch is even greater for GaN semiconductor layers grown on silicon. As a result, the epitaxially grown layers tend to crack when the substrate and layers are cooled from the growth temperature. In addition, the GaN layers tend to bow during the growth process due to the thermal mismatch. This bowing interferes with the uniformity of the layers across the wafer.

Since silicon wafers offer significant advantages over sapphire wafers, a growth technique that reduces the stress caused by the TEC mismatch between the GaN based layers and the underlying substrate is needed.

SUMMARY

The invention includes a device and method for making the same. The device includes a substrate having a first TEC, a stress relief layer overlying the substrate, and crystalline cap layer. The crystalline cap layer overlies the stress relief layer. The cap layer has a second TEC different from the first TEC. The stress relief layer includes an amorphous material that relieves stress between the crystalline substrate and the cap layer arising from differences in the first and second TECs at a growth temperature at which layers are grown epitaxially on the cap layer. The device can be used to construct various semiconductor devices including GaN LEDs that are fabricated on silicon or SiC wafers.

The stress relief layer is generated by depositing a precursor material on the substrate. A layer of semiconductor material is epitaxially grown on precursor material. The precursor material is then converted to stress relief material that relieves stress between the substrate and semiconductor layers arising from differences in the first and second TECs at a growth temperature at which layers are grown epitaxially on the first semiconductor layer.

BRIEF DESCRIPTION OF THE DRAWINGS

FIGS. 1 and 2 are cross-sectional views of a growth substrate according to one embodiment of the present invention.

FIG. 3 illustrates an LED according to the present invention that is constructed on a growth substrate according to one embodiment of the present invention.

FIG. 4 is a cross-sectional view of one LED according to one embodiment of the present invention after the contacts have been provided.

DETAILED DESCRIPTION

Figure 5:
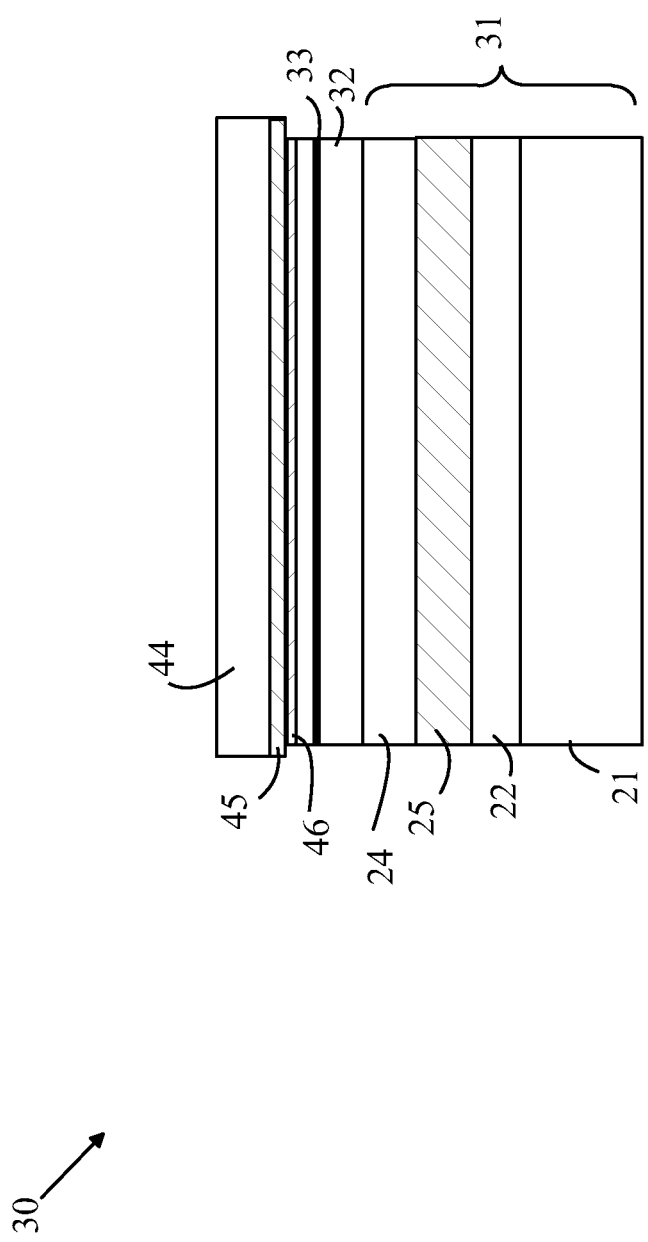
FIG. 5 is a cross-sectional view of the LED wafer shown in FIG. 4 after a second substrate has been attached.

The present invention utilizes an stress relief layer between the growth substrate and the epitaxially grown layers. In one aspect of the invention, the stress relief layer liquefies or becomes pliant during the epitaxial growth process, and hence, relieves any stress caused by the thermal mismatch between the substrate and the epitaxially grown layers to be relieved. When the epitaxially grown layers are cooled, the stress relief layer solidifies.

Refer now to FIGS. 1 and 2, which are cross-sectional views of a growth substrate according to one embodiment of the present invention. Growth substrate 20 is constructed on a silicon wafer 21. An AlN buffer layer 22 is grown on top of substrate 21 to compensate for the differences in lattice constants between the materials of the GaN family and silicon. Next, an InGaN layer 23 is grown on top of layer 22. Finally, a GaN "cap" layer 24 is grown on top of layer 23. The cap layer provides a lattice structure on which subsequent GaN family members can be grown epitaxially after layer 23 has been converted to a metallic layer.

One aspect of the present invention is based on the observation that InGaN can be decomposed into an alloy of In and Ga by exposing the layer to high temperature or annealing the layer. Hence, after the conversion, the growth substrate includes a metal layer 25 that is sandwiched between buffer layer 22 and cap layer 24. The melting point of layer 25 is below the epitaxial growth temperature for subsequent layers of GaN family member layers. Hence, these layers will be grown on a liquid metal layer that prevents the difference in TEC between the silicon and the GaN layers from inducing significant stress in either layer.

Refer now to FIG. 3, which illustrates an LED according to the present invention that is constructed on a growth substrate according to one embodiment of the present invention. LED wafer 30 is constructed by epitaxially growing layers of GaN on a growth substrate 31 that is similar to those described above. The LED layers typically include an n-GAN layer 32, an active layer 33, and a p-GaN layer 34. While LED wafer 30 is described in terms of these three layers, it is to be understood that each of these layers may include a number of sublayers having different compositions. Furthermore, while LED wafer 30 is described in terms of GaN layers, it is to be understood that these layers may be formed of a materials from the GaN family of materials. For the purposes of this discussion, the GaN family of materials is defined to be all alloy compositions of GaN, InN and AlN.

To complete the construction of LED wafer 30, power contacts must be provided to layers 32 and 34 for each of the individual LEDs into which LED wafer 30 is be divided. Referring now to FIG. 4 which is a cross-sectional view of one LED according to one embodiment of the present invention after the contacts have been provided. The contact to the p-GaN layer 43 may include a current spreading layer 42 to improve the uniformity of the current flow through the p-GaN layer. If light is to be extracted through the p-GaN layer, spreading layer 42 must be a transparent material such as indium tin oxide. If light is to be extracted through substrate 21, current spreading layer 42 can be a minor constructed from a layer of silver. The second contact 41 to the n-GaN layer is deposited in an etched trench that terminates on the n-GaN layer.

In some applications, it is advantageous to remove substrate 21. For example, if substrate 21 is a silicon substrate, the blue light generated in the active layer by a GaN LED will be absorbed in the substrate. In one aspect of the present invention, metal layer 25 is used to remove substrate 21 by heating the LED structure to a temperature at which metal layer 25 melts. At this point, substrate 21 and buffer layer 22 can be detached from layer 24. Since the remaining layers are only a few microns thick, these layers must first be attached to a second substrate before substrate 21 is removed. Refer now to FIG. 5, which is a cross-sectional view of LED wafer 30 shown in FIG. 4 after a second substrate has been attached. Carrier substrate 44 is bonded to wafer 30 via an adhesive layer 45. The adhesive layer can be any layer that will withstand the heating of combined structures needed to liquefy metal layer 25.

Figure 6:
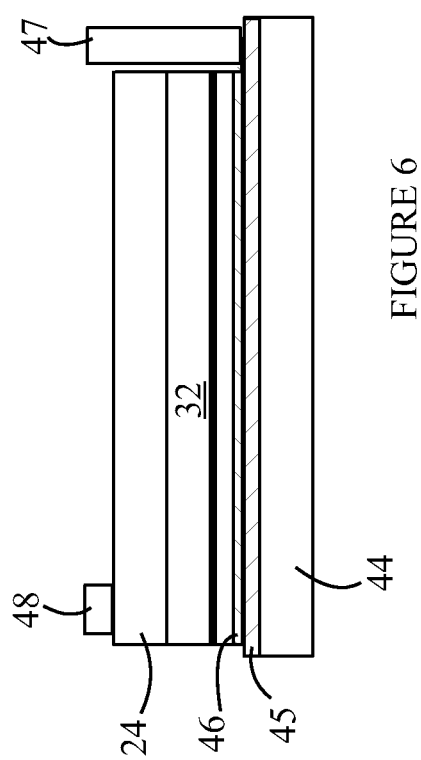
FIG. 6 is a cross-sectional view of an LED utilizing an upside down configuration.

An optional reflective layer 46 can be deposited on the upper surface of the p-GaN layer so that the light is extracted through the bottom surface of layer 24 after substrate 21 and layers 22 and 25 have been removed. The reflective layer can also provide a contact and current spreading function for powering the p-GaN layer. Referring now to FIG. 6, which is a cross-sectional view of an LED utilizing this upside down configuration. In this embodiment, light is extracted through the n-GaN layer 24. Contact 48 connects to this layer which acts as a current spreading layer for the underlying n-GaN layer 32 of the LED. Contact 47 is connected to mirror layer 46 by a trench cut in the LED layered structure. Mirror layer 46 provides the current spreading function for the p-GaN layer.

The present invention has been described in terms of an InGaN layer that is deposited on a buffer layer having a suitable lattice constant and then converted to a metallic layer by heating after a subsequent GaN cap layer has been deposited. This results in a crystalline growth substrate having a buried metallic layer. The GaN cap layer presents a surface on which subsequent layers from the GaN family of materials can be epitaxially grown without substantially reduced stresses resulting from differences in the thermal coefficients of expansion between the GaN family materials and the underlying substrate.

The teachings of the present invention can be applied to other epitaxially grown systems in which the differences between the thermal coefficients of expansion between two layers present significant problems. The method requires that a stress relief layer having two properties be grown between the layers in question. First, the stress relief layer must have a precursor with a lattice constant that is compatible with the lattice constants of the two layers in question and on which the next layer can be epitaxially grown before the precursor material is converted to a layer that will provide stress relief during the subsequent epitaxial growth. Second the precursor must be convertible to a material that will relieve the stress between the first and second layers at the growth temperature of the second and remaining layers. In the examples discussed above, the stress relief layer is a metal that is in the molten state at the growth temperature in question.

In the above-described embodiments, the cap layer was different than the first layer of the light emitting device that was grown on the growth substrate. However, the first layer of semiconductor material of the light emitting device could provide the function of the cap layer. In this case, conversion of stress relief layer needs to be done after the first semiconductor layer is grown. A separate cap layer has the advantage of being a much thinner layer than the conventional first semiconductor layer, and hence, is less affected by the thermal stress caused by the differences in TECs during the growth of the cap layer prior to the precursor material being converted to the stress relief layer.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method for fabricating a semiconductor device, said method comprising:
depositing a precursor stress relief layer on a substrate characterized by a first TEC;
epitaxially depositing a first semiconductor layer on said precursor stress relief layer, said first semiconductor layer being characterized by a second TEC, different from said first TEC; and
converting said precursor stress relief layer to a stress relief layer comprising a stress relief material that relieves stress between said substrate and said first semiconductor layer arising from differences in said first and second TECs at a growth temperature at which layers are grown epitaxially on said first semiconductor layer, said stress relief material being non-crystalline at said growth temperature.

2. The method of claim 1 wherein precursor stress relief layer comprises a material from the GaN family of materials that is converted to said stress relief material.

3. The method of claim 2 wherein said precursor material is converted to said stress relief material by heating said precursor material.

4. The method of claim 1 wherein said precursor material comprises InGaN and wherein said stress relief material comprises an alloy of In and Ga, said alloy being in a liquid state at said growth temperature.

5. The method of claim 1 further comprising epitaxially growing a light emitting device on said first semiconductor layer.

6. The method of claim 5 wherein said light emitting device has a TEC substantially equal to said second TEC.

7. The method of claim 5 wherein said light emitting device is a GaN LED and wherein said substrate comprises a silicon wafer.

8. The method of claim 7 further comprising removing said silicon wafer by heating said semiconductor device to a temperature at which said stress relief layer is in a liquid state.

9. A method for fabricating a semiconductor device, comprising:
depositing a precursor stress relief layer on a substrate, the precursor stress relief layer having a first TEC;
epitaxially depositing a first semiconductor layer on said precursor stress relief layer, said first semiconductor layer having a second TEC different from said first TEC; and
converting said precursor stress relief layer to a stress relief layer comprising a stress relief material that relieves stress between said substrate and said first semiconductor layer arising from differences in said first and second TECs by heating said precursor material at a growth temperature at which layers are grown epitaxially on said first semiconductor layer, said stress relief material being non-crystalline at said growth temperature.

10. The method of claim 9, wherein precursor stress relief layer comprises a material from the GaN family of materials that is converted to said stress relief material.

11. The method of claim 9, wherein said precursor material comprises InGaN and wherein said stress relief material comprises an alloy of In and Ga, said alloy being in a liquid state at said growth temperature.

12. The method of claim 9, further comprising epitaxially growing a light emitting device on said first semiconductor layer.

13. The method of claim 12, wherein said light emitting device has a TEC substantially equal to said second TEC.

14. The method of claim 12, wherein said light emitting device is a GaN LED and wherein said substrate comprises a silicon wafer.

15. The method of claim 14, further comprising removing said silicon wafer by heating said semiconductor device to a temperature at which said stress relief layer is in a liquid state.

* * * * *